(12) United States Patent
Yang et al.

(10) Patent No.: US 11,797,036 B2
(45) Date of Patent: Oct. 24, 2023

(54) DETECTION AND PROTECTION CIRCUIT, POWER SUPPLY CIRCUIT, POWER SUPPLY METHOD OF ACTIVE DEVICE

(71) Applicant: XI'AN ZHONGXING NEW SOFTWARE CO., LTD., Shaanxi (CN)

(72) Inventors: Qian Yang, Guangdong (CN); Jijie Shi, Guangdong (CN)

(73) Assignee: XI'AN ZHONGXING NEW SOFTWARE CO., LTD., Xi'an (CN)

( * ) Notice: Subject to any disclaimer, the term of this patent is extended or adjusted under 35 U.S.C. 154(b) by 217 days.

(21) Appl. No.: 17/285,907

(22) PCT Filed: Nov. 13, 2019

(86) PCT No.: PCT/CN2019/117849
§ 371 (c)(1),
(2) Date: Apr. 15, 2021

(87) PCT Pub. No.: WO2020/108297
PCT Pub. Date: Jun. 4, 2020

(65) Prior Publication Data
US 2021/0373587 A1    Dec. 2, 2021

(30) Foreign Application Priority Data

Nov. 30, 2018    (CN) .......................... 201811463570.9

(51) Int. Cl.
*G01R 31/40*    (2020.01)
*G05F 1/569*    (2006.01)
(Continued)

(52) U.S. Cl.
CPC ............... *G05F 1/569* (2013.01); *G01R 1/30* (2013.01); *G01R 1/36* (2013.01); *G01R 31/282* (2013.01);
(Continued)

(58) Field of Classification Search
CPC . G01R 1/30; G01R 1/36; G01R 1/282; G01R 1/40; G01R 1/52; G01R 1/54; G01R 1/66; G05F 1/569
See application file for complete search history.

(56) References Cited

U.S. PATENT DOCUMENTS 4,251,846 A * 2/1981 Pearson ................. H02H 3/382
361/30
6,313,641 B1 * 11/2001 Brooks ................ H02H 1/0015
361/7

(Continued)

*Primary Examiner* — Patrick Assouad
*Assistant Examiner* — Demetrius R Pretlow

(57) ABSTRACT

A detection and protection circuit includes: a comparator, six resistors, and two diodes. A first resistor is connected to a second resistor. The second resistor (30) is grounded. A positive input end, a negative input end, a power supply end, a ground end, and an output end of the comparator are connected to a third resistor, a fourth resistor, a power management device power supply pin, the ground, and a main controller. The other end of the third resistor is connected between the first resistor and the second resistor. The other end of the fourth resistor is connected to the first resistor. A first power supply is connected between the fourth resistor and the first resistor. A fifth resistor is connected to a sixth resistor. The sixth resistor (70) is grounded. The other end of the fifth resistor is connected to the main controller.

9 Claims, 3 Drawing Sheets

(51) Int. Cl.
*G01R 31/54* (2020.01)
*G01R 31/66* (2020.01)
*G01R 31/52* (2020.01)
*G01R 1/30* (2006.01)
*G01R 1/36* (2006.01)
*G01R 31/28* (2006.01)
*H03K 5/24* (2006.01)

(52) U.S. Cl.
CPC ............. *G01R 31/40* (2013.01); *G01R 31/52* (2020.01); *G01R 31/54* (2020.01); *G01R 31/66* (2020.01); *H03K 5/24* (2013.01)

(56) References Cited

U.S. PATENT DOCUMENTS

| | | | |
|---|---|---|---|
| 2009/0102488 A1* | 4/2009 | Morini | G01R 31/52 |
| | | | 324/509 |
| 2014/0176153 A1* | 6/2014 | Liu | G01R 31/52 |
| | | | 324/537 |
| 2014/0254050 A1* | 9/2014 | Haines | H02H 3/16 |
| | | | 361/42 |
| 2014/0266218 A1* | 9/2014 | Kriebernegg | H05B 45/52 |
| | | | 324/414 |
| 2014/0301000 A1* | 10/2014 | Takahashi | H01M 10/482 |
| | | | 361/42 |
| 2017/0146583 A1* | 5/2017 | Baik | G01R 31/52 |
| 2017/0308108 A1* | 10/2017 | Pigott | G05F 1/571 |
| 2018/0011161 A1* | 1/2018 | Li | G01R 31/52 |
| 2018/0149712 A1* | 5/2018 | Ko | H03K 17/082 |
| 2022/0357409 A1* | 11/2022 | Nakayama | G01R 31/52 |

* cited by examiner

DETECTION AND PROTECTION CIRCUIT, POWER SUPPLY CIRCUIT, POWER SUPPLY METHOD OF ACTIVE DEVICE

This application claims the priority of Chinese patent application CN201811463570.9, entitled "Detection and Protection Circuit, Power Supply Circuit, and Power Supply Method of Active Device" and filed on Nov. 30, 2018, the entirety of which is incorporated herein by reference.

FIELD OF THE INVENTION

The present disclosure relates to the technical field of electronic products, and in particular, to a detection and protection circuit, a power supply circuit, and a power supply method of an active device.

BACKGROUND OF THE INVENTION

At present, electronic products are widely used and can be seen everywhere, and especially due to the emergence of smart electronic products, people's life has been inseparable from application of electronic products. Currently, there are three circuit states for electronic products: short-circuit, disconnected and connected.

Nowadays, many devices are used to detect the circuit state of electronic products, so that connection of the circuit is relatively complicated and is not very reliable.

SUMMARY OF THE INVENTION

The main objective of the present disclosure is to provide a detection and protection circuit, a power supply circuit, and a power supply method of an active device, and the present disclosure aims to provide a detection method with a simpler structure and a detection method.

In order to achieve the above objective, the present disclosure provides a detection and protection circuit of an active device. The detection and protection circuit of the active device includes: a comparator, a first resistor, a second resistor, a third resistor, a fourth resistor, a fifth resistor, a sixth resistor, a first diode, and a second diode. The first resistor is connected in series to the second resistor, and an end of the second resistor away from the first resistor is grounded. A positive input end of the comparator is connected to the third resistor; a negative input end of the comparator is connected to the fourth resistor; a power supply end of the comparator is connected to a power supply output pin of a power management device; a ground end of the comparator is grounded, and an output end of the comparator is connected to a main controller. An end of the third resistor away from the positive input end is connected between the first resistor and the second resistor. An end of the fourth resistor away from the negative input end is connected to the first resistor, and an end of the fourth resistor connected to the first resistor is further connected to a first power supply. The fifth resistor is connected in series to the sixth resistor, an end of the sixth resistor away from the fifth resistor being grounded, an end of the fifth resistor adjacent to the sixth resistor being further connected to the main controller. A negative electrode of the first diode is connected between the fourth resistor and the negative input end, and a positive electrode thereof is connected to a power supply circuit. A positive electrode of the second diode is connected to the negative input end, and a negative electrode thereof is connected to a power supply port of the active device.

Besides, in order to realize the above objective, the present disclosure further provides a power supply circuit of an active device. The power supply circuit of the active device includes a power management device, a detection and protection circuit of the active device, and a third diode. The detection and protection circuit includes: a comparator, a first resistor, a second resistor, a third resistor, a fourth resistor, a fifth resistor, a sixth resistor, a first diode, and a second diode. The first resistor is connected in series to the second resistor, and an end of the second resistor away from the first resistor is grounded. A positive input end of the comparator is connected to the third resistor; a negative input end of the comparator is connected to the fourth resistor; a power supply end of the comparator is connected to a power supply output pin of a power management device; a ground end of the comparator is grounded, and an output end of the comparator is connected to a main controller. An end of the third resistor away from the positive input end is connected between the first resistor and the second resistor. An end of the fourth resistor away from the negative input end is connected to the first resistor, and an end of the fourth resistor connected to the first resistor is further connected to a first power supply. The fifth resistor is connected in series to the sixth resistor, an end of the sixth resistor away from the fifth resistor being grounded, an end of the fifth resistor adjacent to the sixth resistor being further connected to the main controller. A negative electrode of the first diode is connected between the fourth resistor and the negative input end, and a positive electrode thereof is connected to a power supply circuit. A positive electrode of the second diode is connected to the negative input end, and a negative electrode thereof is connected to a power supply port of the active device. The power management device includes a power supply input pin, a power supply output pin, and an enable signal pin. The power supply input pin is connected to a second power supply, the power supply output pin being connected to the power supply end of the comparator in the detection circuit, the enable signal pin being connected to the main controller and an output end of the third diode respectively, an input end of the third diode being connected between the fifth resistor and the sixth resistor.

In addition, in order to realize the above objective, the present disclosure further provides a power supply method of an active device. The power supply method of the active device is applied to the above power supply circuit of the active device, and the power supply method of the active device includes steps of: receiving, by the detection circuit, a first power supply signal input by the first power supply and a power supply signal input by the power management device; processing, by the detection circuit, the first power supply signal and the power supply signal to generate a corresponding first output signal, and acquiring a second output signal, a third output signal, and a fourth output signal according to the first power supply signal; and transmitting, by the detection circuit, the first output signal and the third output signal to the main controller, outputting the second output signal to the power management device, and transmitting the fourth output signal to the active device; and receiving, by the power management device, a second power supply signal input by a second power supply, the second output signal input by the detection circuit, and an enable signal output by the main controller after processing the first output signal and the third output signal; and processing, by the power management device, the second power supply signal, the second output signal, and the enable signal to output a corresponding power supply signal to the detection circuit.

The detection circuit of the active device in the present disclosure includes: a comparator, a first resistor, a second resistor, a third resistor, a fourth resistor, a fifth resistor, a sixth resistor, a first diode, and a second diode. The first resistor is connected in series to the second resistor, and an end of the second resistor away from the first resistor is grounded. A positive input end of the comparator is connected to the third resistor; a negative input end of the comparator is connected to the fourth resistor; a power supply end of the comparator is connected to a power supply output pin of a power management device; a ground end of the comparator is grounded; and an output end of the comparator is connected to a main controller. An end of the third resistor away from the positive input end is connected between the first resistor and the second resistor. An end of the fourth resistor away from the negative input end is connected to the first resistor, and an end of the fourth resistor connected to the first resistor is further connected to a first power supply. The fifth resistor is connected in series to the sixth resistor, an end of the sixth resistor away from the fifth resistor being grounded, an end of the fifth resistor adjacent to the sixth resistor being further connected to the main controller. A negative electrode of the first diode is connected between the fourth resistor and the negative input end, and a positive electrode thereof is connected to a power supply circuit. A positive electrode of the second diode is connected to the negative input end, and a negative electrode thereof is connected to a power supply port of the active device.

Implementation of the objective, functional features, and advantages of the present disclosure will be further described with reference to the drawings.

DETAILED DESCRIPTION OF THE EMBODIMENTS

It should be understood that, detailed embodiments described herein are only used to explain the present disclosure, rather than to limit the present disclosure.

Technical solutions in embodiments of the present disclosure will be described clearly and completely below with reference to the accompanying drawings for embodiments of the present disclosure. Obviously, the embodiments described are only some embodiments of the present disclosure, rather than all embodiments of the present disclosure. All other embodiments obtained, based on embodiments in the present disclosure, by a person of ordinary skill in the art without making any creative effort fall into the protection scope of the present disclosure.

It should be noted that, all directional indications (such as upper, lower, left, right, front, back . . . ) in the embodiments of the present disclosure are only used to explain relative positional relationships of respective parts, motion circumstances thereof, and so on in a certain posture (as shown in the accompanying drawings). If the certain posture changes, the directional indications change correspondingly.

Besides, description involving "first", "second" and so on is used simply for description of the present disclosure, rather than for indicating or suggesting relative importance of technical features or implicitly indicating the number of the technical features described. Therefore, a feature preceded by "first" and "second" includes explicitly or implicitly at least one such feature. In addition, technical solutions of respective embodiments may be combined with each other, but should be combined in a manner that the technical solutions can be realized by those skilled in the art. When there is contradiction in combination of technical solutions or the combination of technical solutions cannot be realized, it should be considered that the combination neither exists nor falls into the protection scope of the present disclosure.

Figure 1:
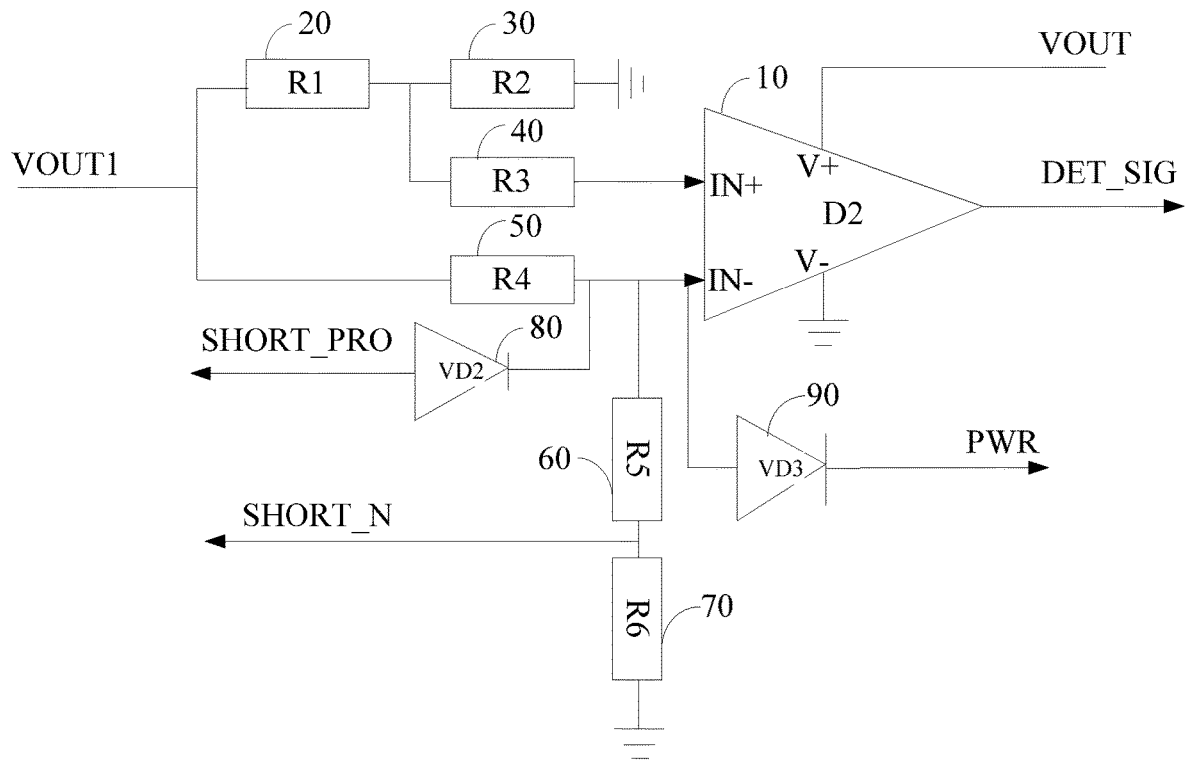
FIG. 1 schematically shows a structure in a first embodiment of a detection and protection circuit of an active device.

Referring to FIG. 1, FIG. 1 schematically shows a structure in a first embodiment of a detection circuit in the present disclosure. The detection circuit includes: a comparator 10, a first resistor 20, a second resistor 30, a third resistor 40, a fourth resistor 50, a fifth resistor 60, a sixth resistor 70, a first diode 80, and a second diode 90. The first resistor 20 is connected in series to the second resistor 30, and an end of the second resistor 30 away from the first resistor 20 is grounded. A positive input end of the comparator 10 is connected to the third resistor 40; a negative input end of the comparator 10 is connected to the fourth resistor 50; a power supply end of the comparator 10 is connected to a power supply output pin of a power management device; a ground end of the comparator 10 is grounded; and an output end of the comparator 10 is connected to a main controller. An end of the third resistor away from the positive input end is connected between the first resistor and the second resistor. An end of the fourth resistor away from the negative input end is connected to the first resistor, and an end of the fourth resistor connected to the first resistor is further connected to a first power supply. The fifth resistor is connected in series to the sixth resistor, an end of the sixth resistor away from the fifth resistor being grounded, an end of the fifth resistor adjacent to the sixth resistor being further connected to the main controller. A negative electrode of the first diode is connected between the fourth resistor and the negative input end, and a positive electrode of the first diode is connected to a power supply circuit. A positive electrode of the second diode is connected to the negative input end, and a negative electrode of the second diode is connected to a power supply port of the active device.

Signals in the circuit include: a signal VOUT, a signal VOUT1, a signal SHORT_PRO, a signal SHORT_N, a signal PWR, and a signal DET_SIG.

The comparator D2 has five ports, i.e., IN+, IN−, V+, V−, and OUTPUT respectively. V+ is a power supply port, and is generally connected to an output signal of the power supply circuit of the active device. V− is a grounding signal, and is generally connected to a digital ground. IN+ and IN− are two input ports, and the comparator compares voltages at these two ports. If VIN+−VIN−>0, a high voltage level of a V+ pin is output by an OUTPUT pin. That is, the signal DET_SIG is the high voltage level of the V+ pin. On the contrary, if VIN+−VIN−<0, a low voltage level of a V− pin is output by the OUTPUT pin. That is, the signal DET_SIG is the low voltage level of the V− pin. A signal output by the OUTPUT pin is an output signal DET_SIG of the comparator.

A resistor R1 (3.01 KΩ) and a resistor R2 (100 KΩ) together divide a voltage level at VOUT1, and a voltage level after voltage dividing is connected to an IN+ pin of the comparator via a resistor R3 (0Ω). An end of a resistor R4 (15Ω) is connected to VOUT1 power supply, and the other end thereof is connected to an IN− pin of the comparator. A resistor R5 (24 KΩ) and a resistor R6 (40.2 KΩ) together divide a voltage level at the IN− pin of the comparator, and a voltage level after voltage dividing is the signal SHORT_N which is input into the main controller. A signal at an IN− input end of the comparator is changed, through a reversely connected diode VD2, into the signal SHORT_PRO, which is used to notify the power supply circuit of occurring of a short circuit in the system, and the VD2 serves to prevent the signal SHORT_PRO. The signal at the IN− input end of the comparator is further changed, through a diode VD3, into the signal PWR, which is connected to the power supply port of the active device, and the VD3 serves to prevent occurring of current backflow due to an external power supply of the active device being greater than VOUT1. R1 may be 3.01 KΩ; R2 may be 100 KΩ; R3 may be 0Ω; R4 may be 15Ω; R5 may be 24 KΩ; and R6 may be 40.2 KΩ. In specific implementation, corresponding resistance values for respective resistors may be selected as required.

The present disclosure may be applied in a circuit module of a terminal having an external port. The active device may be an antenna module, a USB module, a battery module or an LCD module, and so on.

The detection circuit of the active device in the present disclosure includes: a comparator, a first resistor, a second resistor, a third resistor, a fourth resistor, a fifth resistor, a sixth resistor, a first diode, and a second diode. The first resistor is connected in series to the second resistor, and an end of the second resistor away from the first resistor is grounded. A positive input end of the comparator is connected to the third resistor; a negative input end of the comparator is connected to the fourth resistor; a power supply end of the comparator is connected to a power supply output pin of a power management device; a ground end of the comparator is grounded; and an output end of the comparator is connected to a main controller. An end of the third resistor away from the positive input end is connected between the first resistor and the second resistor. An end of the fourth resistor away from the negative input end is connected to the first resistor, and an end of the fourth resistor connected to the first resistor is further connected to a first power supply. The fifth resistor is connected in series to the sixth resistor, an end of the sixth resistor away from the fifth resistor being grounded, an end of the fifth resistor adjacent to the sixth resistor being further connected to the main controller. A negative electrode of the first diode is connected between the fourth resistor and the negative input end, and a positive electrode of the first diode is connected to a power supply circuit. A positive electrode of the second diode is connected to the negative input end, and a negative electrode of the second diode is connected to a power supply port of the active device. By means of the above manner, the present disclosure realizes the effect of effectively recognizing a state of the active device by using only one comparator, uses a relatively small number of devices, has a relatively simple connection structure, is realized by circuit only, and is relatively reliable.

Figure 2:
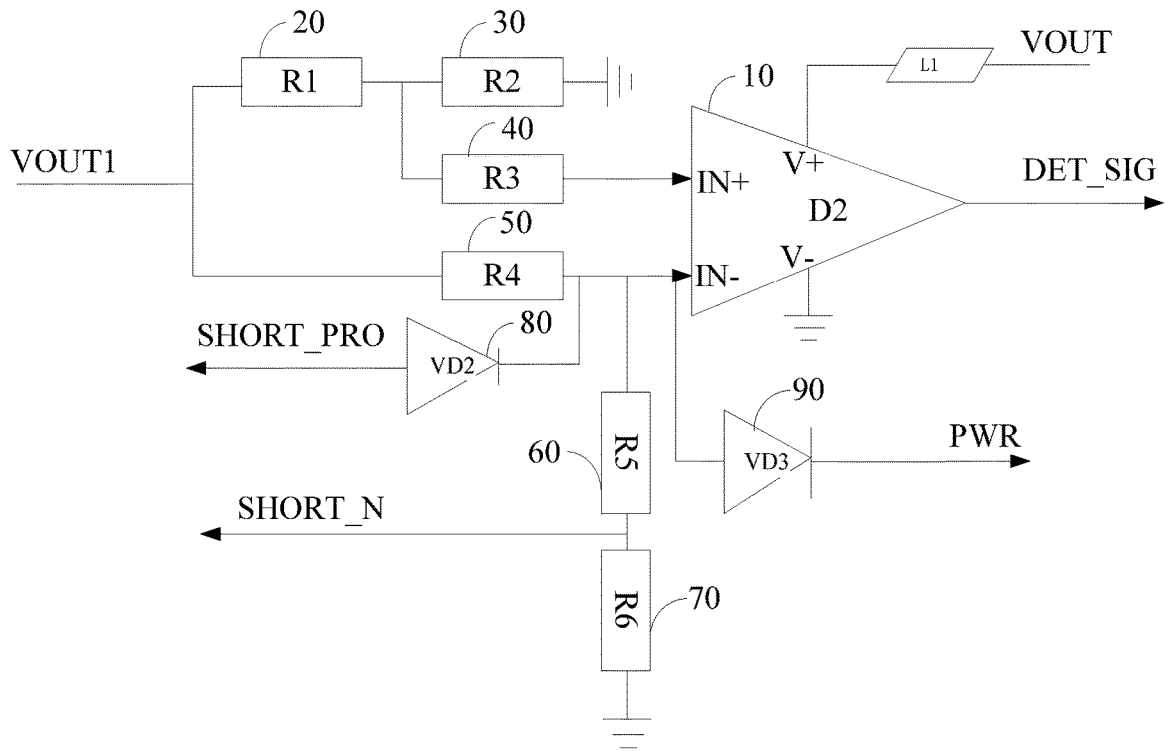
FIG. 2 schematically shows a structure in a second embodiment of the detection and protection circuit of an active device.

In an embodiment, referring to FIG. 2 and based on the above embodiment, the detection and protection circuit further includes a magnetic bead, which is connected between the power supply end of the comparator and the power supply output pin of the power management device.

The magnetic bead L1 has a filtering function, and is connected between the power supply end of the comparator and the power supply output pin of the power management device. That is, one end of the magnetic bead L1 is connected to a voltage level at VOUT, and the other end thereof is connected to a voltage level at VOUT1.

In an embodiment, the detection and protection circuit further includes: a first power filter capacitor (not shown in the drawings), a second power filter capacitor (not shown in the drawings), and a third power filter capacitor (not shown in the drawings). The first power filter capacitor is connected between the power supply output pin of the power management device and the power supply end of the comparator; the second power filter capacitor is connected at an end of the first resistor away from the second resistor; and the third power filter capacitor is connected between the second diode and the power supply port of the active device.

In the present embodiment, power filter capacitors are disposed at positions of the power supply. The power filter capacitors are respectively located between the power supply output pin of the power management device and the power supply end of the comparator, at the end of the first resistor away from the second resistor, and between the second diode and the power supply port of the active device. By means of the power filter capacitors, respective input or output voltages become smooth and stable.

Figure 3:
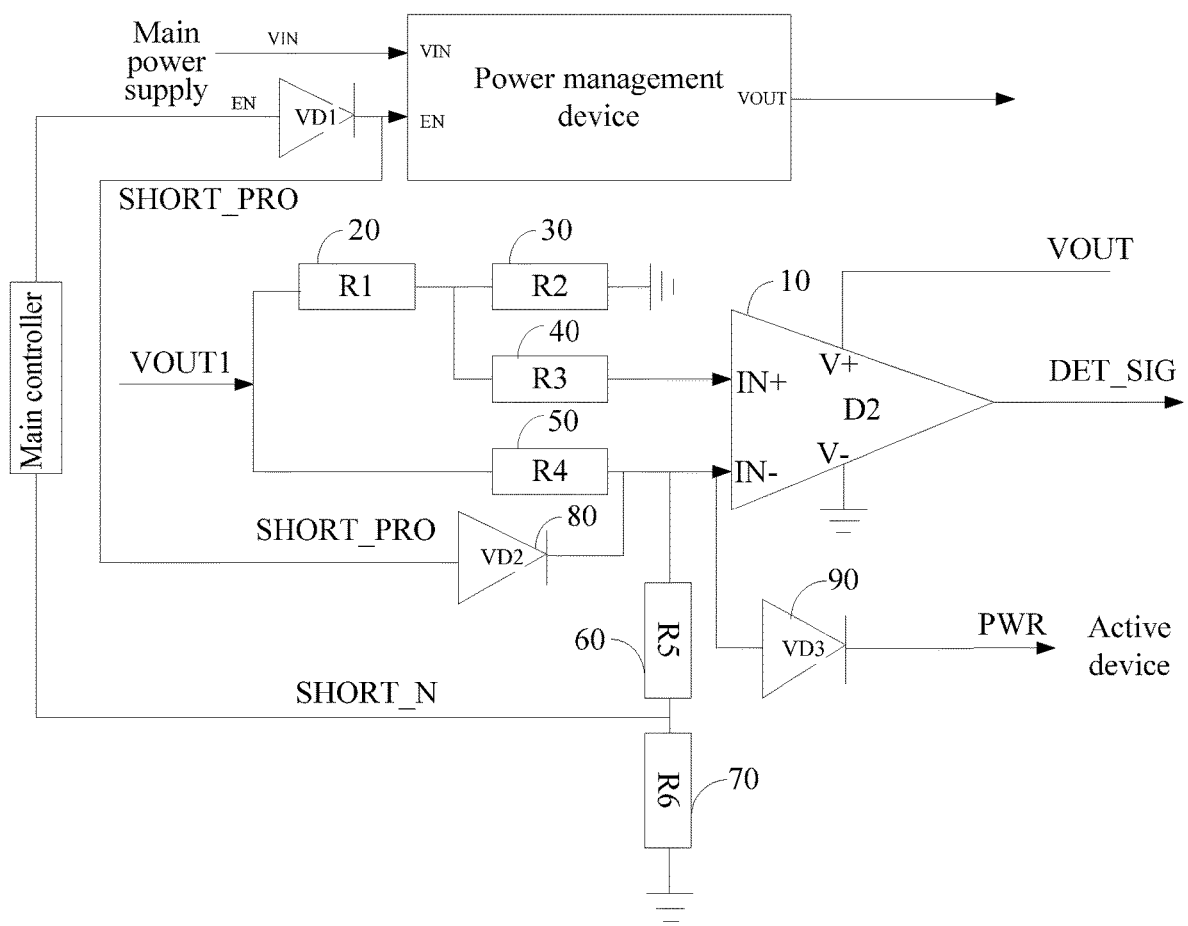
FIG. 3 schematically shows a structure in an embodiment of a power supply circuit of an active device.

Referring to FIG. 3, FIG. 3 schematically shows a structure in an embodiment of a power supply circuit of an active device.

The present disclosure further provides a power supply circuit of an active device. The power supply circuit of the active device includes: a power management device, a detection and protection circuit of the active device, and a third diode. The detection and protection circuit includes: a comparator, a first resistor, a second resistor, a third resistor, a fourth resistor, a fifth resistor, a sixth resistor, a first diode, and a second diode. The first resistor is connected in series to the second resistor, and an end of the second resistor away from the first resistor is grounded. A positive input end of the comparator is connected to the third resistor; a negative input end of the comparator is connected to the fourth resistor; a power supply end of the comparator is connected to a power supply output pin of the power management device; a ground end of the comparator is grounded; and an output end of the comparator is connected to a main controller. An end of the third resistor away from the positive input end is connected between the first resistor and the second resistor. An end of the fourth resistor away from the negative input end is connected to the first resistor, and an end of the fourth resistor connected to the first resistor is further connected to a first power supply. The fifth resistor is connected in series to the sixth resistor, an end of the sixth resistor away from the fifth resistor being grounded, an end of the fifth resistor adjacent to the sixth resistor being further connected to the main controller. A negative electrode of the first diode is connected between the fourth resistor and the negative input end, and a positive electrode of the first diode is connected to a power supply circuit. A positive electrode of the second diode is connected to the negative input end, and a negative electrode of the second diode is connected to a power supply port of the active device. The power management device includes a power supply input pin, a power supply output pin, and an enable signal pin. The power supply input pin is connected to a second power supply, the power supply output pin being connected to the power supply end of the comparator in the detection circuit, the enable signal pin being connected to the main controller and an output end of the third diode respectively. An input end of the third diode is connected between the fifth resistor and the sixth resistor.

Signals in the circuit include: a signal VOUT, a signal VOUT1, a signal SHORT_PRO, a signal SHORT_N, a signal PWR, and a signal DET_SIG.

The comparator D2 has five ports, i.e., IN+, IN−, V+, V−, and OUTPUT respectively. V+ is a power supply port, and is generally connected to an output signal of the power supply circuit of the active device. V− is a grounding signal, and is generally connected to a digital ground. IN+ and IN− are two input ports, and the comparator compares voltages at these two ports. If VIN+−VIN−>0, a high voltage level of a V+ pin is output by an OUTPUT pin. That is, the signal DET_SIG is the high voltage level of the V+ pin. On the contrary, if VIN+−VIN−<0, a low voltage level of a V− pin is output by the OUTPUT pin. That is, the signal DET_SIG is the low voltage level of the V− pin. A signal output by the OUTPUT pin is an output signal DET_SIG of the comparator.

A resistor R1 (3.01 KΩ) and a resistor R2 (100 KΩ) together divide a voltage level at VOUT1, and a voltage level after voltage dividing is connected to an IN+ pin of the comparator via a resistor R3 (0Ω). An end of a resistor R4 (15Ω) is connected to VOUT1 power supply, and the other end thereof is connected to an IN− pin of the comparator. A resistor R5 (24 KΩ) and a resistor R6 (40.2 KΩ) together divide a voltage level at the IN− pin of the comparator, and a voltage level after voltage dividing is the signal SHORT_N which is input into the main controller. A signal at an IN− input end of the comparator is changed, through a reversely connected diode VD2, into the signal SHORT_PRO, which is used to notify the power supply circuit of occurring of a short circuit in the system, and the VD2 serves to prevent the signal SHORT_PRO. The signal at the IN− input end of the comparator is further changed, through a diode VD3, into the signal PWR, which is connected to the power supply port of the active device, and the VD3 serves to prevent occurring of current backflow due to an external power supply of the active device being greater than VOUT1. R1 may be 3.01 KΩ; R2 may be 100 KΩ; R3 may be 0Ω; R4 may be 15Ω; R5 may be 24 KΩ; and R6 may be 40.2 KΩ. In specific implementation, corresponding resistance values for respective resistors may be selected as required.

D1 is the power management device, and is the core of the power supply circuit. The power management device may be a switch, an LDO (low dropout regulator) or a DC/DC (switching power supply circuit), and so on. The power management device needs to include at least: a VIN pin, i.e., a power supply input pin; a VOUT pin, i.e., a power supply output pin; and an EN pin, i.e., an enable signal of the power management device, which may control turn-on or turn-off of the power management device. VD1 serves to prevent backflow of a high voltage level of the signal SHORT_PRO to an EN signal pin, so as to protect connection between an end of the main controller and the EN signal pin. VIN is a main power supply part. VIN is an input signal of the power management device, and is generally 5 V±0.5 V in a terminal product. VOUT is an output signal of the power management device. VOUT is a power supply part of the detection and protection circuit of the active device, and is generally 5 V, 3.6 V, 3.3 V, and so on. The VIN is changed to the VOUT through the power management device, and the power management device may be devices such as a switch, an LDO, and a DC/DC and is not limited to these devices. EN is an enable signal given by the main controller. It is used for controlling turn-on or turn-off of the power management device. The controlling may be in a software manner, and may also be in a hardware manner. That is, the EN is used for supplying power for a certain circuit. SHORT_PRO is a short-circuit protection signal given by the protection circuit in FIG. 3 after a short circuit occurs in the system, and it is connected to the enable signal of the power management device in FIG. 3.

The present disclosure may be applied in a circuit module of a terminal having an external port. The active device may be an antenna module, a USB module, a battery module or an LCD module, and so on.

The detection circuit of the active device in the present disclosure includes: a comparator, a first resistor, a second resistor, a third resistor, a fourth resistor, a fifth resistor, a sixth resistor, a first diode, and a second diode. The first resistor is connected in series to the second resistor, and an end of the second resistor away from the first resistor is grounded. A positive input end of the comparator is connected to the third resistor; a negative input end of the comparator is connected to the fourth resistor; a power supply end of the comparator is connected to a power supply output pin of the power management device; a ground end of the comparator is grounded; and an output end of the comparator is connected to a main controller. An end of the third resistor away from the positive input end is connected between the first resistor and the second resistor. An end of the fourth resistor away from the negative input end is connected to the first resistor, and an end of the fourth resistor connected to the first resistor is further connected to a first power supply. The fifth resistor is connected in series to the sixth resistor, an end of the sixth resistor away from the fifth resistor being grounded, an end of the fifth resistor adjacent to the sixth resistor being further connected to the main controller. A negative electrode of the first diode is connected between the fourth resistor and the negative input end, and a positive electrode thereof is connected to a power supply circuit. A positive electrode of the second diode is connected to the negative input end, and a negative electrode thereof is connected to a power supply port of the active device. By means of the above manner, the present disclosure realizes the effect of effectively recognizing a state of the active device by using only one comparator, uses a relatively small number of devices, has a relatively simple connection structure, is realized by circuit only, and is relatively reliable.

In an embodiment, the detection and protection circuit further includes a magnetic bead, which is connected between the power supply end of the comparator and the power supply output pin of the power management device.

The magnetic bead L1 has a filtering function, and is connected between the power supply end of the comparator and the power supply output pin of the power management device. That is, one end of the magnetic bead L1 is connected to a voltage level at VOUT, and the other end thereof is connected to a voltage level at VOUT1.

In an embodiment, the detection and protection circuit further includes: a first power filter capacitor (not shown in the drawings), a second power filter capacitor (not shown in the drawings), and a third power filter capacitor (not shown in the drawings). The first power filter capacitor is connected between the power supply output pin of the power management device and the power supply end of the comparator; the second power filter capacitor is connected at an end of the first resistor away from the second resistor; and the third power filter capacitor is connected between the second diode and the power supply port of the active device.

In the present embodiment, power filter capacitors (not shown in the drawings) are disposed at positions of the power supply. The power filter capacitors are respectively located between the power supply output pin of the power management device and the power supply end of the comparator, at an end of the first resistor away from the second resistor, and between the second diode and the power supply port of the active device. By means of the power filter capacitors, respective input or output voltages become smooth and stable.

Figure 4:
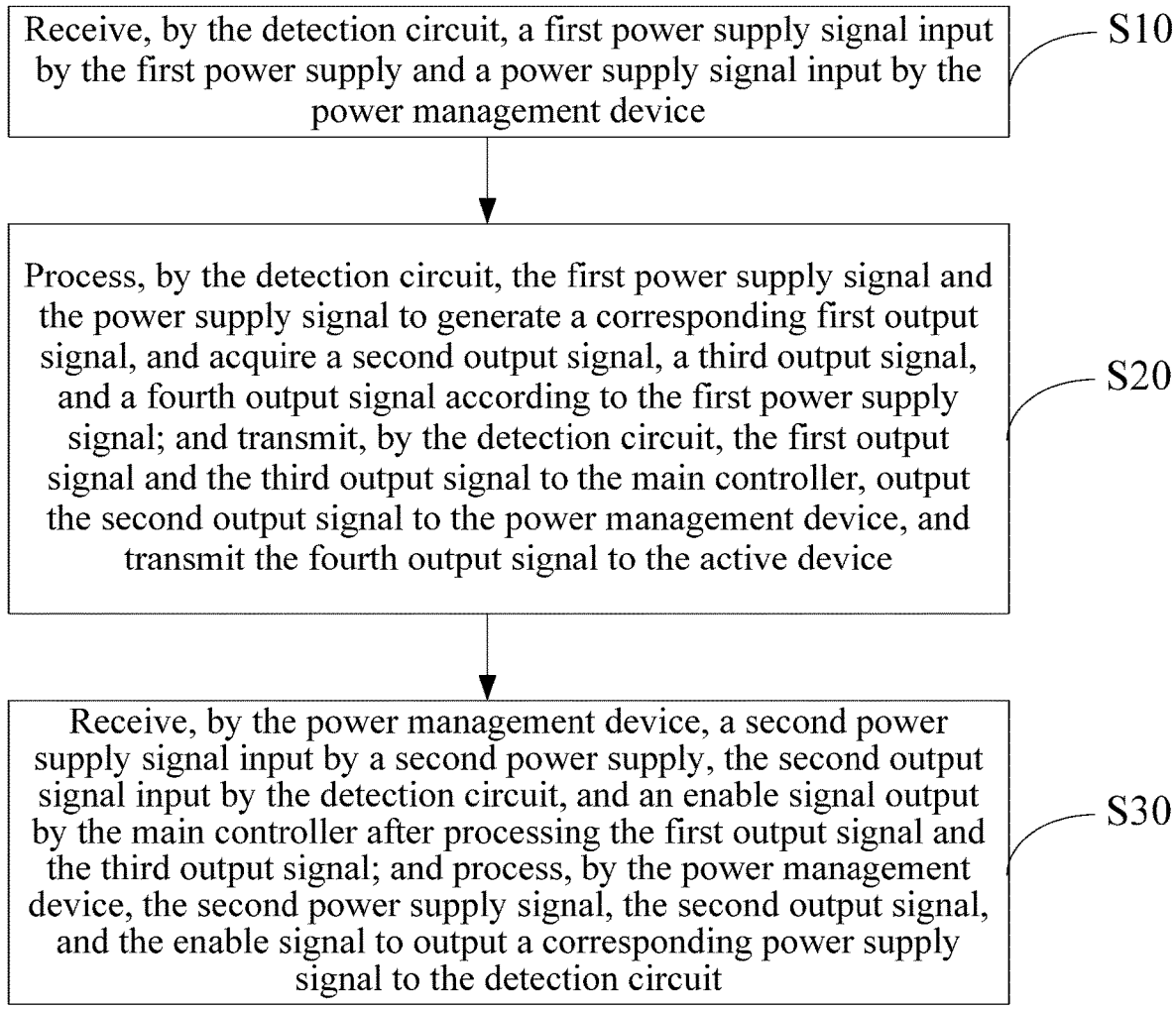
FIG. 4 schematically shows a flowchart in an embodiment of a power supply method of an active device.

Referring to FIG. 4, FIG. 4 schematically shows a flowchart in an embodiment of a power supply method of an active device. The power supply method of the active device includes the following steps.

At step S10, the detection circuit receives a first power supply signal input by the first power supply and a power supply signal input by the power management device.

The power supply method of the active device is realized based on the above power supply circuit of the active device. The power supply circuit of the active device includes: a comparator 10, a first resistor 20, a second resistor 30, a third resistor 40, a fourth resistor 50, a fifth resistor 60, a sixth resistor 70, a first diode 80, and a second diode 90.

The first resistor 20 is connected in series to the second resistor 30, and an end of the second resistor 30 away from the first resistor 20 is grounded. A positive input end of the comparator 10 is connected to the third resistor 40; a negative input end of the comparator 10 is connected to the fourth resistor 50; a power supply end of the comparator 10 is connected to a power supply output pin of a power management device; a ground end of the comparator 10 is grounded; and an output end of the comparator 10 is connected to a main controller. An end of the third resistor away from the positive input end is connected between the first resistor and the second resistor. An end of the fourth resistor away from the negative input end is connected to the first resistor, and an end of the fourth resistor connected to the first resistor is further connected to a first power supply. The fifth resistor is connected in series to the sixth resistor, an end of the sixth resistor away from the fifth resistor being grounded, an end of the fifth resistor adjacent to the sixth resistor being further connected to the main controller. A negative electrode of the first diode is connected between the fourth resistor and the negative input end, and a positive electrode thereof is connected to a power supply circuit. A positive electrode of the second diode is connected to the negative input end, and a negative electrode thereof is connected to a power supply port of the active device.

Signals in the circuit include: a signal VOUT, a signal VOUT1, a signal SHORT_PRO, a signal SHORT_N, a signal PWR, and a signal DET_SIG.

At step S20, the detection circuit processes the first power supply signal and the power supply signal to generate a corresponding first output signal, and acquires a second output signal, a third output signal, and a fourth output signal according to the first power supply signal; and the detection circuit transmits the first output signal and the third output signal to the main controller, outputs the second output signal to the power management device, and transmits the fourth output signal to the active device.

At step S30, the power management device receives a second power supply signal input by a second power supply, the second output signal input by the detection circuit, and an enable signal output by the main controller after processing the first output signal and the third output signal; and the power management device processes the second power supply signal, the second output signal, and the enable signal to output a corresponding power supply signal to the detection circuit.

The comparator D2 has five ports, i.e., IN+, IN−, V+, V−, and OUTPUT respectively. V+ is a power supply port, and is generally connected to an output signal of the power supply circuit of the active device. V− is a grounding signal, and is generally connected to a digital ground. IN+ and IN− are two input ports, and the comparator compares voltages at these two ports. If VIN+−VIN−>0, a high voltage level of a V+ pin is output by an OUTPUT pin. That is, the signal DET_SIG is the high voltage level of the V+ pin. On the contrary, if VIN+−VIN−<0, a low voltage level of a V− pin is output by the OUTPUT pin. That is, the signal DET_SIG is the low voltage level of the V− pin. A signal output by the OUTPUT pin is an output signal DET_SIG of the comparator. The signal output by the OUTPUT pin is the output signal DET_SIG of the comparator, which is defined as the first output signal.

A resistor R1 (3.01 KΩ) and a resistor R2 (100 KΩ) together divide a voltage level at VOUT1, and a voltage level after voltage dividing is connected to an IN+ pin of the comparator via a resistor R3 (0Ω). An end of a resistor R4 (15Ω) is connected to VOUT1 power supply, and the other end thereof is connected to an IN− pin of the comparator. A resistor R5 (24 KΩ) and a resistor R6 (40.2 KΩ) together divide a voltage level at the IN− pin of the comparator, and a voltage level after voltage dividing is the signal SHORT_N which is defined as the third output signal and is input into the main controller. A signal at an IN− input end of the comparator is changed, through a reversely connected diode VD2, into the signal SHORT_PRO, which is defined as the second output signal and is used to notify the power supply circuit of occurring of a short circuit in the system, and the VD2 serves to prevent the signal SHORT_PRO. The signal at the IN− input end of the comparator is further changed, through a diode VD3, into the signal PWR, which is defined as the fourth output signal and is connected to the power supply port of the active device. The VD3 serves to prevent occurring of current backflow due to an external power supply of the active device being greater than VOUT1. R1 may be 3.01 KΩ; R2 may be 100 KΩ; R3 may be 0Ω; R4 may be 15Ω; R5 may be 24 KΩ; and R6 may be 40.2 KΩ. In specific implementation, corresponding resistance values for respective resistors may be selected as required.

D1 is the power management device, and is the core of the power supply circuit. The power management device may be a switch, an LDO (low dropout regulator) or a DC/DC (switching power supply circuit), and so on. The power management device needs to include at least: a VIN pin, i.e., a power supply input pin; a VOUT pin, i.e., a power supply output pin; and an EN pin, i.e., an enable signal of the power management device, which may control turn-on or turn-off of the power management device. VD1 serves to prevent backflow of a high voltage level of the signal SHORT_PRO to an EN signal pin, so as to protect connection between an end of the main controller and the EN signal pin. VIN is a main power supply part. VIN is an input signal of the power management device, and is generally 5 V±0.5 V. VOUT is an output signal of the power management device. VOUT is a power supply part of the detection and protection circuit of the active device, and is generally 5 V, 3.6 V, 3.3 V, and so on. The VIN is changed to the VOUT through the power management device, and the power management device may be devices such as a switch, an LDO, and a DC/DC and is not limited to these devices. EN is an enable signal given by the main controller, and is used for controlling turn-on or turn-off of the power management device. The controlling may be in a software manner, and may also be in a hardware manner. That is, the EN is used for supplying power for a certain circuit. SHORT_PRO is a short-circuit protection signal given by the protection circuit in FIG. 3 after a short circuit occurs in the system, and is connected to the enable signal of the power management device in FIG. 3.

The present disclosure may be applied in a circuit module of a terminal having an external port. The active device may be an antenna module, a USB module, a battery module or an LCD module, and so on.

The detection circuit of the active device in the present disclosure includes: a comparator, a first resistor, a second resistor, a third resistor, a fourth resistor, a fifth resistor, a sixth resistor, a first diode, and a second diode. The first resistor is connected in series to the second resistor, and an end of the second resistor away from the first resistor is grounded. A positive input end of the comparator is connected to the third resistor; a negative input end of the comparator is connected to the fourth resistor; a power supply end of the comparator is connected to a power supply output pin of the power management device; a ground end of the comparator is grounded; and an output end of the comparator is connected to a main controller. An end of the third resistor away from the positive input end is connected between the first resistor and the second resistor. An end of the fourth resistor away from the negative input end is connected to the first resistor, and an end of the fourth resistor connected to the first resistor is further connected to a first power supply. The fifth resistor is connected in series to the sixth resistor, an end of the sixth resistor away from the fifth resistor being grounded, an end of the fifth resistor adjacent to the sixth resistor being further connected to the main controller. A negative electrode of the first diode is connected between the fourth resistor and the negative input end, and a positive electrode thereof is connected to a power supply circuit. A positive electrode of the second diode is connected to the negative input end, and a negative electrode thereof is connected to a power supply port of the active device. By means of the above manner, the present disclosure realizes the effect of effectively recognizing a state of the active device by using only one comparator, uses a relatively small number of devices, has a relatively simple connection structure, is realized by circuit only, and is relatively reliable.

In an embodiment, based on the above embodiment, the step S30 may include the following steps. At step S31, when the fourth output signal is 0 V, the main controller determines that a short circuit occurs in the system according to the third output signal and controls the power management device to disconnect. At step S32, when the fourth output signal is not 0 V, the main controller determines that the circuit of the active device is disconnected or connected according to the first output signal.

The active device works normally, and determines whether the PWR signal, i.e., the fourth output signal, is 0 V. If the PWR signal is 0 V, voltage levels of the SHORT_PRO signal and the SHORT_N signal are both 0 V, and voltage level of EN pin of D1 is lowered. The main controller determines that a short circuit occurs. The device D1 is controlled to disconnect, and power supply of the active circuit is cut off. A short circuit occurs in the system. Then, the determination as to whether the short circuit is eliminated is performed repetitively.

If the PWR signal is not 0 V, it is determined whether there is current flowing through the resistor R4 and whether there is a voltage drop on the resistor R4.

If there is a voltage drop on the resistor R4, step S112 is performed. A voltage at the IN− pin of the comparator is VOUT1−R4*A. Since the voltage at the IN+ pin is a divided voltage of the signal VOUT1, a calculation (VIN+)−(VIN−) =R4*A−R1*VOUT1/(R1+R2) is performed according to a reference value R2*VOUT1/(R1+R2) and according to the working principle of the comparator. Then, step S114 is performed. Resistance values of R1, R2, and R4 are reasonably configured according an actual voltage value of VOUT1, so that R4*A−R1*VOUT1/(R1+R2)>0. The OUTPUT pin of the comparator outputs a high voltage level. Then, step S116 is performed. The main controller knows that the active circuit is connected at this time.

If there is no voltage drop, the voltage at the IN− pin of the comparator is VOUT1. Since a voltage at the IN+ pin is a divided voltage of the signal VOUT1, it is obvious that the voltage at the IN− pin is higher than the voltage at the IN+ pin according to a reference value R2*VOUT1/(R1+R2). The OUTPUT pin of the comparator outputs a low voltage level. The main controller knows that the active circuit is disconnected at this time.

An embodiment is provided as follows.

Supposing that R4=15Ω, R1=3.01 KΩ, R2=100 KΩ, A=27 mA, VOUT1=5 V, a current flowing through the resistor R4 is 27 mA during normal working.

If the system is in a short-circuit state at this time, the signal PWR, the signal SHORT_PRO, and the signal SHORT_N are all 0 V. Thus, the voltage level of EN pin of the device D1 is lowered, and D1 is disconnected. The main controller knows that a short circuit occurs at this time.

If the system is in a disconnected state at this time, voltages at the pins of the comparator are: (VIN+)=4.85 V, and (VIN−)=5 V. It is determined that (VIN+)<(VIN−), and thus the comparator outputs a low voltage level signal.

If the system is in a connected state at this time, voltages at the pins of the comparator are: (VIN+)=4.85 V, and (VIN−)=4.595 V. It is determined that (VIN+)>(VIN−), and thus the comparator outputs a high voltage level signal.

It can be seen from the flowchart and the embodiment that the main controller may know a state (as shown in the following table) of the active device at this time through the signal SHORT_N and the signal DET_SIG.

| SHORT_N | DET_SIG | State of the active device |
| --- | --- | --- |
| low | X | short-circuit |
| high | low | disconnected |
| high | high | connected |

It should be noted that, terms of "comprise", "include" or any other variants herein intend to cover non-exclusive inclusion, so that a process, a method, an article, or a system including a series of elements not only includes those elements but also includes other elements not listed explicitly or elements inherent to the process, the method, the article, or the system. In the case of no more limitations, the situation where an element preceded by "comprising a (an)" doesn't exclude that the process, the method, the article, or the system comprising this element further comprises the same other element.

Serial numbers for the embodiments of the present disclosure are only used for description, rather than representing precedence of an embodiment.

The present disclosure can effectively recognize a state of the active device. By means of the above manner, the present disclosure realizes the effect of effectively recognizing a state of the active device by using only one comparator, uses a relatively small number of devices, has a relatively simple connection structure, is realized by circuit only, and is relatively reliable.

The above embodiments are only preferred embodiments of the present disclosure and do not limit the protection scope of the present disclosure. Equivalent structural or flowchart changes made based on the description and the accompanying drawings of the present disclosure, or direct or indirect application in other relevant technical fields all fall into the protection scope of the present disclosure likewise.

The invention claimed is:

1. A detection and protection circuit of an active device, wherein the detection and protection circuit comprises: a comparator, a first resistor, a second resistor, a third resistor, a fourth resistor, a fifth resistor, a sixth resistor, a first diode, and a second diode, wherein the first resistor is connected in series to the second resistor, and an end of the second resistor away from the first resistor is grounded; a positive input end of the comparator is connected to the third resistor, a negative input end of the comparator being connected to the fourth resistor, a power supply end of the comparator being connected to a power supply output pin of a power management device, a ground end of the comparator being grounded, an output end of the comparator being connected to a main controller; an end of the third resistor away from the positive input end is connected between the first resistor and the second resistor; an end of the fourth resistor away from the negative input end is connected to the first resistor, and an end of the fourth resistor connected to the first resistor is further connected to a first power supply; the fifth resistor is connected in series to the sixth resistor, an end of the sixth resistor away from the fifth resistor being grounded, an end of the fifth resistor adjacent to the sixth resistor being further connected to the main controller; a negative electrode of the first diode is connected between the fourth resistor and the negative input end, and a positive electrode of the first diode is connected to a power supply circuit; and a positive electrode of the second diode is connected to the negative input end, and a negative electrode of the second diode is connected to a power supply port of the active device.

2. The detection and protection circuit according to claim 1, wherein the detection and protection circuit further comprises:
a magnetic bead, which is connected between the power supply end of the comparator and the power supply output pin of the power management device.

3. The detection and protection circuit according to claim 1, wherein the detection and protection circuit further comprises:
a first power filter capacitor, a second power filter capacitor, and a third power filter capacitor, wherein the first power filter capacitor is connected between the power supply output pin of the power management device and the power supply end of the comparator, the second power filter capacitor being connected at an end of the first resistor away from the second resistor, and the third power filter capacitor being connected between the second diode and the power supply port of the active device.

4. A power supply circuit of an active device, wherein the power supply circuit of the active device comprising:
a power management device, a detection and protection circuit of the active device, and a third diode,
wherein the detection and protection circuit comprises: a comparator, a first resistor, a second resistor, a third resistor, a fourth resistor, a fifth resistor, a sixth resistor, a first diode, and a second diode, wherein the first resistor is connected in series to the second resistor, and an end of the second resistor away from the first resistor is grounded; a positive input end of the comparator is connected to the third resistor, a negative input end of the comparator being connected to the fourth resistor, a power supply end of the comparator being connected to a power supply output pin of a power management device, a ground end of the comparator being grounded, an output end of the comparator being connected to a main controller; an end of the third resistor away from the positive input end is connected between the first resistor and the second resistor; an end of the fourth resistor away from the negative input end is connected to the first resistor, and an end of the fourth resistor connected to the first resistor is further connected to a first power supply; the fifth resistor is connected in series to the sixth resistor, an end of the sixth resistor away from the fifth resistor being grounded, an end of the fifth resistor adjacent to the sixth resistor being further connected to the main controller; a negative electrode of the first diode is connected between the fourth resistor and the negative input end, and a positive electrode of the first diode is connected to a power supply circuit; and a positive electrode of the second diode is connected to the negative input end, and a negative electrode of the second diode is connected to a power supply port of the active device, and the power management device comprises a power supply input pin, a power supply output pin, and an enable signal pin, the power supply input pin is connected to a second power supply, the power supply output pin being connected to the power supply end of the comparator in the detection and protection circuit, the enable signal pin being connected to the main controller and an output end of the third diode respectively, an input end of the third diode being connected between the fifth resistor and the sixth resistor.

5. The power supply circuit of the active device according to claim 4, wherein the detection and protection circuit further comprises:
a magnetic bead, which is connected between the power supply end of the comparator and the power supply output pin of the power management device.

6. The power supply circuit of the active device according to claim 4, wherein the detection and protection circuit further comprises:
a first power filter capacitor, a second power filter capacitor, and a third power filter capacitor, wherein the first power filter capacitor is connected between the power supply output pin of the power management device and the power supply end of the comparator, the second power filter capacitor being connected at an end of the first resistor away from the second resistor, and the third power filter capacitor being connected between the second diode and the power supply port of the active device.

7. The power supply circuit of the active device according to claim 4, wherein the power management device is a switch, a low dropout regulator, or a switching power supply circuit.

8. A power supply method of an active device, wherein the power supply method of the active device is applied to the power supply circuit of the active device according to claim 4, and the power supply method of the active device comprises steps of:
- receiving, by the detection and protection circuit, a first power supply signal input by the first power supply and a power supply signal input by the power management device;
- processing, by the detection and protection circuit, the first power supply signal and the power supply signal to generate a corresponding first output signal, and acquiring a second output signal, a third output signal, and a fourth output signal according to the first power supply signal; and transmitting, by the detection and protection circuit, the first output signal and the third output signal to the main controller, outputting the second output signal to the power management device, and transmitting the fourth output signal to the active device; and
- receiving, by the power management device, a second power supply signal input by a second power supply, the second output signal input by the detection and protection circuit, and an enable signal output by the main controller after processing the first output signal and the third output signal; and processing, by the power management device, the second power supply signal, the second output signal, and the enable signal to output a corresponding power supply signal to the detection and protection circuit.

9. The power supply method of the active device according to claim 8, wherein the steps of receiving, by the power management device, a second power supply signal input by a second power supply, the second output signal input by the detection and protection circuit, and an enable signal output by the main controller after processing the first output signal and the third output signal and processing, by the power management device, the second power supply signal, the second output signal, and the enable signal to output a corresponding power supply signal to the detection and protection circuit comprise steps of:
- determining, by the main controller, that a short circuit occurs in a system according to the third output signal when the fourth output signal is 0 V, and controlling the power supply management device to disconnect; and
- determining, by the main controller, that a circuit of the active device is disconnected or connected according to the first output signal when the fourth output signal is not 0 V.

\* \* \* \* \*